US010615133B2

(12) United States Patent
Kamgaing et al.

(10) Patent No.: US 10,615,133 B2
(45) Date of Patent: Apr. 7, 2020

(54) DIE PACKAGE WITH SUPERPOSER SUBSTRATE FOR PASSIVE COMPONENTS

(71) Applicant: INTEL CORPORATION, Santa Clara, CA (US)

(72) Inventors: Telesphor Kamgaing, Chandler, AZ (US); Valluri R. Rao, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/910,606

(22) PCT Filed: Sep. 27, 2013

(86) PCT No.: PCT/US2013/062388
§ 371 (c)(1),
(2) Date: Feb. 5, 2016

(87) PCT Pub. No.: WO2015/047330
PCT Pub. Date: Apr. 2, 2015

(65) Prior Publication Data
US 2016/0181211 A1    Jun. 23, 2016

(51) Int. Cl.
*H01L 23/66* (2006.01)
*H01L 25/065* (2006.01)
(Continued)

(52) U.S. Cl.
CPC ............ *H01L 23/66* (2013.01); *H01L 23/481* (2013.01); *H01L 23/49822* (2013.01);
(Continued)

(58) Field of Classification Search
None
See application file for complete search history.

(56) References Cited

U.S. PATENT DOCUMENTS 8,288,209 B1 * 10/2012 Chi .................... H01L 21/4832
438/106
8,710,642 B2    4/2014 Takahashi
(Continued)

FOREIGN PATENT DOCUMENTS

CN    101031862    9/2007
CN    102077344    5/2011
(Continued)

OTHER PUBLICATIONS

Search and Examination Report from Counterpart GB Patent Application No. GB1416330.7, dated Feb. 26, 2015, 5 pages.
(Continued)

*Primary Examiner* — Benjamin P Sandvik
(74) *Attorney, Agent, or Firm* — Schwabe, Williamson & Wyatt, P.C.

(57) ABSTRACT

A die package is described that includes a substrate to carry passive components. In one example, the package has a semiconductor die having active circuitry near a front side of the die and having a back side opposite the front side, and a component substrate near the back side of the die. A plurality of passive electrical components are on the component substrate and a conductive path connects a passive component to the active circuitry. The die has a silicon substrate between the front side and the back side and the conductive path is a through-silicon via through the die from the back side to the active circuit.

17 Claims, 12 Drawing Sheets

(51) Int. Cl.
*H01L 23/48* (2006.01)
*H01L 23/498* (2006.01)
*H01L 25/16* (2006.01)
*H01L 23/538* (2006.01)
*H01L 25/00* (2006.01)

(52) U.S. Cl.
CPC .. *H01L 23/49827* (2013.01); *H01L 23/49833* (2013.01); *H01L 23/5389* (2013.01); *H01L 25/0657* (2013.01); *H01L 25/16* (2013.01); *H01L 25/50* (2013.01); *H01L 2223/6616* (2013.01); *H01L 2223/6655* (2013.01); *H01L 2223/6672* (2013.01); *H01L 2224/16225* (2013.01); *H01L 2224/16265* (2013.01); *H01L 2225/0652* (2013.01); *H01L 2225/06517* (2013.01); *H01L 2225/06544* (2013.01); *H01L 2225/06555* (2013.01); *H01L 2225/06572* (2013.01); *H01L 2225/06582* (2013.01)

(56) References Cited

U.S. PATENT DOCUMENTS

| | | | |
|---|---|---|---|
| 9,048,112 | B2 | 6/2015 | Pan et al. |
| 9,059,304 | B2 | 6/2015 | Meyer et al. |
| 9,691,696 | B2 * | 6/2017 | Shen ................ H01L 21/4803 |
| 2003/0218870 | A1 * | 11/2003 | Fisher ............... H01L 23/49822 361/792 |
| 2004/0178508 | A1 | 9/2004 | Nishimura et al. |
| 2005/0094465 | A1 | 5/2005 | Gervasi |
| 2006/0025102 | A1 * | 2/2006 | Kipnis ................ H01L 25/0655 455/333 |
| 2006/0071650 | A1 | 4/2006 | Narendra et al. |
| 2007/0013080 | A1 | 1/2007 | DiBene et al. |
| 2007/0085648 | A1 * | 4/2007 | Lee ................... H01F 17/0033 336/200 |
| 2007/0235850 | A1 | 10/2007 | Gerber et al. |
| 2009/0321939 | A1 | 12/2009 | Chandrasekeran |
| 2010/0102430 | A1 * | 4/2010 | Lee ........................ H01L 24/73 257/690 |
| 2010/0127345 | A1 | 5/2010 | Sanders et al. |
| 2011/0050334 | A1 | 3/2011 | Pan et al. |
| 2011/0068433 | A1 * | 3/2011 | Kim ..................... H01L 23/552 257/531 |
| 2011/0278741 | A1 * | 11/2011 | Chua ................... H01L 21/561 257/777 |
| 2011/0317387 | A1 | 12/2011 | Pan et al. |
| 2012/0032314 | A1 * | 2/2012 | Chen .................... H01L 21/563 257/666 |
| 2012/0074585 | A1 * | 3/2012 | Koo ...................... H01L 21/486 257/774 |
| 2012/0139103 | A1 | 6/2012 | New |
| 2012/0147578 | A1 * | 6/2012 | Jin .......................... H01F 19/04 361/774 |
| 2012/0241950 | A1 | 9/2012 | Takahashi |
| 2012/0267794 | A1 * | 10/2012 | Ding ................. H01L 21/76898 257/774 |
| 2012/0273960 | A1 * | 11/2012 | Park ................... H01L 21/4846 257/774 |
| 2012/0280366 | A1 | 11/2012 | Kamgaing et al. |
| 2012/0280380 | A1 * | 11/2012 | Kamgaing ........... H01Q 1/1271 257/679 |
| 2012/0280860 | A1 * | 11/2012 | Kamgaing ........... H01Q 1/2283 342/368 |
| 2013/0127025 | A1 | 5/2013 | Cho |
| 2013/0175686 | A1 | 7/2013 | Meyer et al. |
| 2013/0181354 | A1 | 7/2013 | Khan et al. |
| 2013/0284572 | A1 | 10/2013 | Teh et al. |
| 2014/0333480 | A1 | 11/2014 | Kamgaing et al. |

FOREIGN PATENT DOCUMENTS

| | | |
|---|---|---|
| CN | 102934227 | 2/2013 |
| CN | 103283023 | 9/2013 |
| CN | 103597593 | 2/2014 |
| EP | 2803086 | 11/2014 |
| JP | H 9-219468 A | 8/1997 |
| JP | 2004-214509 A | 7/2004 |
| JP | 2004-273938 | 9/2004 |
| JP | 2004-273938 A | 9/2004 |
| JP | 2004-304159 | 12/2004 |
| JP | 2005-217225 A | 8/2005 |
| JP | 2008-166373 A | 12/2006 |
| JP | 2010-103475 | 5/2010 |
| JP | 2010-278334 A | 12/2010 |
| JP | 2012-204631 A | 3/2011 |
| JP | 2012-015554 | 1/2012 |
| JP | 2012-15554 A | 1/2012 |
| JP | 2012-119688 A | 6/2012 |
| JP | 2012-204631 | 10/2012 |
| JP | 2012-221973 A | 11/2012 |
| JP | 2015-507360 | 3/2015 |
| JP | 2017-85147 | 5/2017 |
| KR | 10-2010-0045331 A2 | 11/2010 |
| KR | 2011-0118948 | 2/2011 |
| KR | 10-2011-0137059 | 12/2011 |
| KR | 10-2011-0039699 | 11/2012 |
| KR | 10-2013-0023104 | 3/2014 |
| KR | 10-2014-0014259 | 10/2015 |
| SG | 194737 | 12/2013 |
| TW | 201246502 | 11/2012 |
| TW | 201332075 | 8/2013 |
| WO | WO 2000/54337 | 9/2000 |
| WO | WO 2005/099110 | 10/2005 |
| WO | WO 2010101163 | 9/2010 |
| WO | WO 2012-087287 | 6/2012 |
| WO | WO 2012/151003 | 11/2012 |
| WO | WO 2013/104712 | 7/2013 |

OTHER PUBLICATIONS

Written Opinion of the International Searching Authority for International Application No. PCT/US2013/062388, dated Jun. 30, 2014, 15 pages.
Office Action from Counterpart GB Patent Application No. GB1416330.7, dated Mar. 31, 2016, 21 pages.
Search Report from counterpart Taiwan Patent Application No. 103132645, dated May 16, 2016, 1 page.
Supplementary European Search Report from counterpart European Patent Application No. EP 13894760, dated Apr. 5, 2017, 7 pages.
English translation of JP 2010-103475, dated May 6, 2010, Lee et al.
English translation of JP 2004-273938, dated Sep. 30, 2004, Nishimura, et al.
English translation of JP 2012-015554, dated Jan. 19, 2012, Kawada.
English translation of JP 2012-204631, dated Oct. 22, 2012, Takahashi.
Search Report from Counterpart Chinese Patent Application No. 2014105029839, dated Dec. 16, 2016, 3 pages.
Second Office Action from the Chinese Patent Office dated Jun. 23, 2017 for Chines Patent Application No. 201410502983.9 (8 pages).
Official Letter (12 pages) and Search Report (2 pages) from the Taiwan State Intellectual Property Office dated Aug. 2, 2017 for Taiwan Patent Application No. 105143413 and English Translation of Search Report (2 pages).
Notice of Allowance from the Taiwan State Intellectual Property Office dated Nov. 28, 2016 for Taiwan Patent Application No. 103132645 (2 pages) and English Translation (1 page) thereof.
Notification Concerning Transmittal of International Preliminary Report on Patentability dated Apr. 27, 2016 for PCT/US2013/062388 (11 Pages).
Exam Report for Great Britain App No. GB 1416330.7, dated Jun. 30, 2017, 3 pages.
Intention to Grant for Great Britain App No. GB 1416330.7, dated Mar. 7, 2018, 2 pages.
Office Action for Great Britian Patent Application No. 1416330.7 dated Jun. 30, 2016, 3 pages.
Office Action for Japanese Patent Application No. 2016-534570 dated Mar. 7, 2017, 10 pages.

(56) References Cited

OTHER PUBLICATIONS

Office Action for Japanese Patent Application No. 2016-534570 dated Jun. 5, 2018, 8 pages.
Office Action for Korean Patent Application No. 10-2016-7005077 dated Apr. 19, 2017, 14 pages.
Office Action for Korean Patent Application No. 10-2016-7005077 dated Jul. 30, 2018, 8 pages.
International Preliminary Report for PCT Patent Application No. PCT/US2013/062388 dated , Apr. 7, 2016, 11 pages.
Office Action for Taiwan Patent Application No. 105143413 dated Apr. 20, 2018, 16 pages.
Office Action for Korean Patent Application No. 2016-7005077, dated Oct. 29, 2017, 12 pgs.
Office Action for Chinese Patent Application No. 201410502983.9, dated Dec. 5, 2017, 12 pgs.
Office Action for Great Britain Patent Application No. GB1416330.7, dated Oct. 17, 2017, 4 pgs.
Office Action from Japanese Patent App. No. 2016-534570, dated Nov. 11, 2018, 7 pages (including English translation).
Examination Report from Great Britain Patent App. No. GB 1416330.7, dated Jan. 17, 2018, 4 pages.
Office Action for Taiwan Patent Application No. 105143413 dated Aug. 10, 2018, 5 pages.
Office Action for Korean Patent Application No. 10-2016-7005077, dated Sep. 28, 2018, 11 pages.
Office Action from European Patent Application 13894760.1, dated Feb. 26, 2019, 8 pgs.
Notice of Allowance for Chinese Patent Application No. 201410502983.9 dated Sep. 5, 2018, 5 pgs.
Notice of Allowance for Japanese Patent Application No. 2016-534570 dated Dec. 11, 20185, 2 pgs.
Office Action for Taiwan Patent Application No. 105143413 dated Dec. 19, 2018, 2 pgs.
Office Action from Korean Patent Application No. 10-2018-7031416, dated Feb. 26, 2019, 8 pgs.
Office Action from European Patent Application No. 13894760.1, dated Oct. 7, 2019, 8 pages.
Office Action from Japanese Patent Application No. 2018-188648 , dated Sep. 3, 2019, 4 pages.
Notice of Allowance from Korean Patent Application No. 10-2018-7031416, dated Aug. 28, 2019, 3 pages.
Notice of Allowance from Taiwan Patent Application No. 105143413, dated Sep. 19, 2019, 2 pages.

* cited by examiner

US 10,615,133 B2

DIE PACKAGE WITH SUPERPOSER SUBSTRATE FOR PASSIVE COMPONENTS

CROSS-REFERENCE TO RELATED APPLICATION

This patent application is a U.S. National Phase Application under 35 U.S.C. § 371 of International Application No. PCT/US2013/062388, filed Sep. 27, 2013, entitled DIE PACKAGE WITH SUPERPOSED SUBSTRATE FOR PASSIVE COMPONENTS.

FIELD

The present disclosure relates to semiconductor packaging and, in particular, to packaging with connections to passive electrical components.

BACKGROUND

RF (Radio Frequency) systems and high speed digital systems require high Q (Quality Factor) passive components, such as capacitors, inductors, and transformers. These components are used in part to ensure that the analog RF and power supply circuits of the chip provide the accuracy necessary for any of a variety of RF functions, such as filtering, amplification, demodulation, upconversion, etc. and for digital processing. For cellular telephones, computers, and a wide variety of other radio equipped devices, RF chips are used to process analog and baseband radio signals. These chips are packaged for protection and to make them easier to mount to a circuit board.

Because it is difficult or expensive to produce sufficiently high Q passive components in a silicon semiconductor chip, passive components are often made separately from the chip and connected to the chip through an external connection. The components are then placed inside the package on the package substrate or in some cases on the outside of the package.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1A:
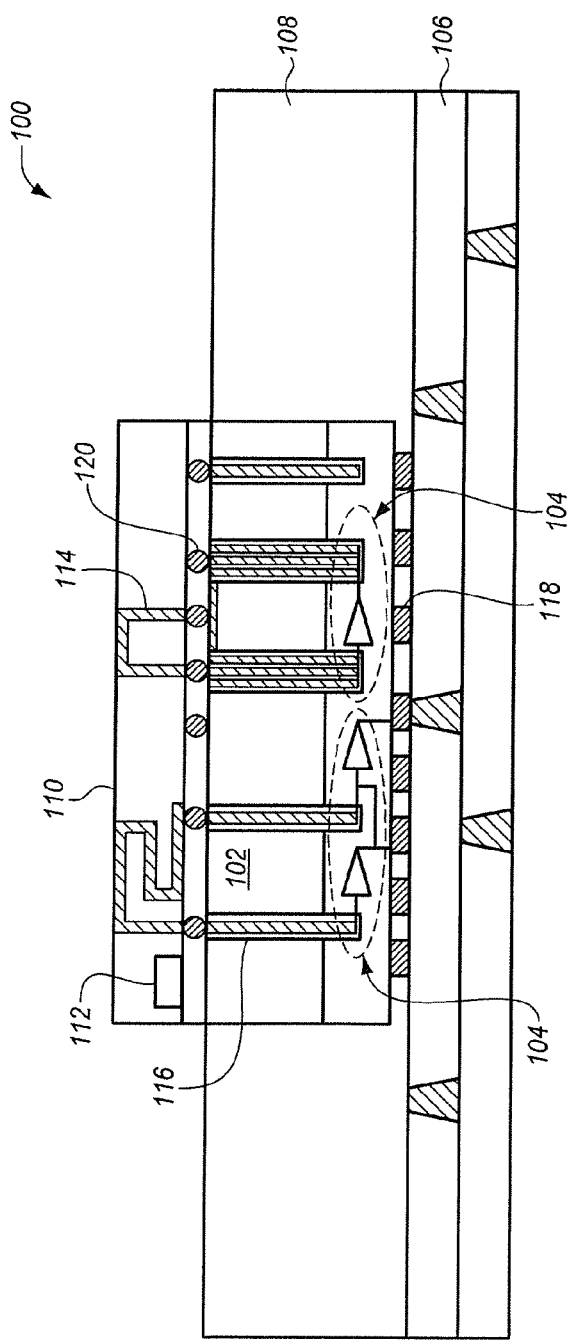
FIG. 1A is a cross-sectional side view of a package formed using a superposer for passive components according to an embodiment of the invention.

As more different types of electronic, electrical, and RF systems are integrated into fewer packages, it becomes more difficult to place passive electrical components close to or inside a semiconductor chip package. SoCs (System on a Chip) with integrated radios, power management, and voltage regulation use many passive components, especially inductors and transformers. For some RF applications, the inductors and transformers are either made on high resistivity silicon or the circuits are partitioned so that the critical RF passives are on the package.

Forming planar passive components on high resistivity silicon requires a significant part of the total area of the die. This is expensive for an on-die radio. In addition, the performance of the RF passives degrades with as the resistivity of the substrate decreases. When a SoC die is flip-chip assembled, the passives come into close proximity to the package substrate that requires continuous power and ground planes for the digital circuits and for proper signal referencing. The degradation becomes more pronounced with fine pitch assembly and with embedded die technology.

For power management circuits, the quality factor of an inductor is less critical than its AC (Alternating Current) and DC (Direct Current) series resistance. In order to reduce the DC series resistance, ultra-thick conductors are used but these cannot be easily accommodated on an SoC chip. For that reason, fully integrated on-chip voltage regulators use off-chip inductors assembled or embedded in the package substrate. Such components are typically assembled on the package as discrete or embedded components.

A superposer substrate with high performance passive components may be placed on or near the back side of a die such as an SoC die or analog RF die. A separate substrate superposed over the die may be used for both RF and power delivery performance enhancements. Unlike a traditional interposer that is usually sandwiched between the package substrate and the die first level interconnect, this substrate may be a superposer attached on or near the back side of the assembled die. The superpose substrate may be electrically connected to the die using TSVs (Through-Silicon Vias), TBVs (Through-Body Vias), TMVs (Through-Mold Vias), wire leads or a combination of these connection types.

The substrate that carries the passive components may be made from a glass, a high resistivity silicon, a ceramic, or other package substrates including organic and inorganic. The substrate may carry and incorporate many passive components. Different substrate materials have different properties and the passive components will be different for each substrate material. Different materials may be selected to suit different packaging applications or to provide particular characteristics for the passives, depending on the particular application. For a glass substrate, vertical inductors and transformers, which exhibit superior electrical performance and occupy less chip area may be used. Vertical components may be combined with horizontal components and separately placed components. Components may also be formed in the vias that connect the substrate to the die.

FIG. 1A is a cross-sectional view of an example of using a superposer to carry passive components over a die. A die, for example, an SoC or RF die 102 with voltage regulation or radio frequency circuits 104 or both is assembled on a Flip-Chip or embedded organic package substrate 106. As illustrated, the die is embedded in mold compound 108 and then a package or die routing layer is formed on the front side of the die over the active circuits 104. The substrate 106, die 102, component substrate 110, and mold compound 108 combine with the connections and vias to form a package 100. The die has analog or digital circuits or both. It may be formed on any a variety of different types of substrates such as silicon, gallium arsenide, or ceramic.

A superposer substrate 110 that includes passive components 112, such as inductors, transformers, capacitors, and resistors, among others, is assembled on the back side 114 of the SoC die 102. The passive components included in the superposer substrate are electrically connected to the circuits of the main SoC die. For a die on a silicon substrate, the connection is made using through silicon vias (TSV) 116. For other types of die substrates, the vias will be through the other type of substrate material of the back side of the die. The TSVs may be first drilled through the die substrate to make the intended connection, lined with an electrically insulating, anti-migration layer, and then filled with copper.

The superposer substrate may be formed of any of a variety of different materials as mentioned above. A glass substrate does not require an anti-migration layer and may include both vertical components based on through-glass vias and planar passive components. In one example, SCHOTT AF32® eco Thin Glass is used with a CTE of 3.2 ppm/K which matches the silicon of the die. This glass has a polished surface is stable to 600° C. and is very dielectric. It can easily be cut by any saw that can cut a silicon die or wafer. In another embodiment, a photodefinable glass such as APEX® glass may be used. This type of ceramic glass can be exposed and processed through semiconductor processes leading to extra fine conductor lines and spaces as well as ultra-small and fine pitch copper vias.

Figure 2:
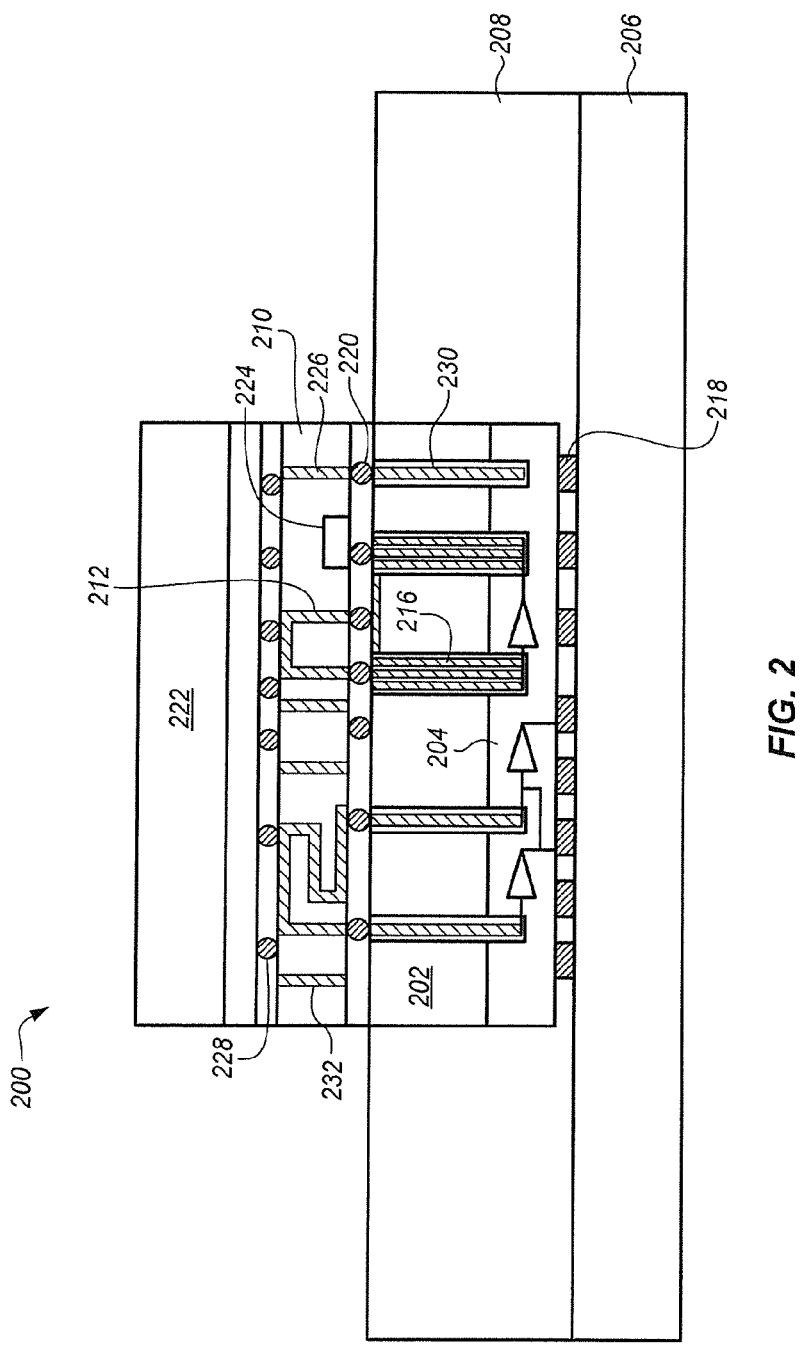
FIG. 2 is a cross-sectional side view of a package formed using two stacked dies and a superposer for passive components according to an embodiment of the invention.

Alternatively, the superposer may be a silicon, glass, or alumina-based integrated passive device (TPD) with or without its own through body vias. A thin layer of IPD substrate that is oxide bonded, thinned, or layer transferred, may be used. The superposer substrate can be attached on the back of the topmost die in a 3D stack or it may be assembled on the back of a die that is within a 3D stack as shown in FIG. 2.

As shown, the superposer is a substrate for passive components 112. The passives may be formed on or in the substrate using any of a variety of different techniques. Both the top and bottom surfaces of the surface may have conductive paths that are printed, deposited or formed with photolithography. The surface paths may be used to connect vertical paths through the substrate to form loops. The surface paths may also be in the form of inductive loops, interdigitated lines for capacitors and other configurations. The surface paths may also be used to transpose the position of a vertical path to align with a connection pad, bump, or TSV of the die or another connection pathway. The substrate may also be formed of stacked layers with horizontal surface paths to connect different layers of the stack. The vertical copper filled vias may be combined or patterned to form loops, capacitors and other features.

As shown, the front side of the die 102 has an interconnection area 118, such as a solder bump or C4 (Controlled Collapse Chip Connection) connection area to connect electrically and physically to the substrate 106. In the case of an RDL, the die may be formed directly over the connection pads of the die.

Similarly, the back side 114 of the die has a connection area with solder joints 120 such as micro bumps to the superposer substrate 110. The connection area is protected with an underfill between the back side of the die and the component substrate. These connections connect the passive components of the substrate back to the active circuits of the die.

The dies may have via pads over a silicon dioxide layer which is polished flush to form a flush surface with copper pads. The connection surface may also be coated with a nitride after being polished flat. This may then be followed by an oxide coating depending on the particular type of die and its intended application The TSVs in the die may be designed to also contribute an element of inductance, capacitance, or resistance to the path to and from the active circuits. Additional dies may be added above, below, and beside the die shown in FIG. 1, depending on the particular implementation.

Figure 1B:
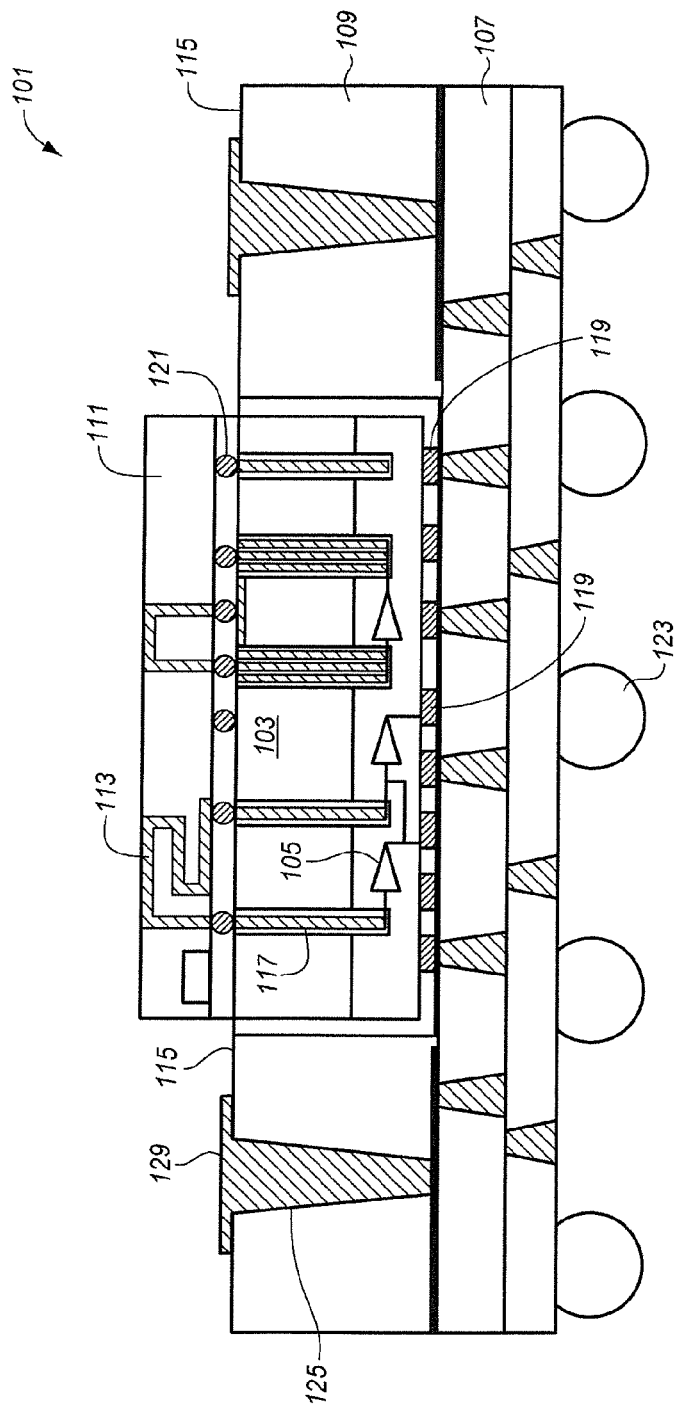
FIG. 1B is a cross-sectional side view of an alternative package formed using a superposer for passive components according to an embodiment of the invention.

FIG. 1B is a cross-sectional view of a more detailed example of using a superposer to carry passive components over a die. The die 103 has voltage regulation or radio frequency circuits 105 that are embedded in organic package substrate build-up layers 109. Die bumps 119, such as copper bumps are formed on the front side of the die. The die routing layer 109 is formed on the front side of the die. It may be plated directly on the die bumps to connect to the active circuits 105. The lower build-up layers 107 provide fan-out and routing to a BGA (Ball Grid Array) 123 or any other package attachment system.

A superposer substrate 111 is attached over RDL pads 121 on the back side 115 of the die. The superposer includes passive components 113 that are electrically connected to the circuits of the main SoC die. Through silicon vias (TSV) 117 from the superposer through the back side of the die connect the passives to the active circuits. Underfill may be used between the back side of the die and the component substrate.

The embedded die package 101 may be formed in any of a variety of different ways. In one example, a substrate is formed with a cavity for the die. The die including its copper die bumps is then attached to the substrate. Additional build-up layers may be formed and connected to existing build-up layers or to the die bumps. The cavity may then be filled with the same material as the build-up layers. In another example, the die is embedded in a molding compound which is then polished off the front side of the die to expose contact areas. Die bumps are then attached in appropriate locations to allow build-up layers to be formed and connected to the die bumps.

The package 101 may have additional features to allow for additional components. In the illustrated example, the package substrate 107 includes POP vias 125 to connect routing layers in the build-up layers to POP pads 129 opposite the BGA side of the package. The POP vias allow one or more additional dies or packages to be stacked over or beside the superposer substrate.

FIG. 2 is a cross-sectional diagram of a package 200 with a multi-die stack. The component superposer substrate 210 provides passives 212 to both top 222 and bottom 202 dies. The proximity of the component substrate 210 to the top die reduces the IR drops in power delivery applications and the insertion loss for RF applications. The bottom die 202 is embedded in a mold compound 208 and the front side of the die is attached to a package in the form of build-up layers, a substrate, or RDL 206 through, for example, a die bump, solder bump, or C4 array. The back side of the die is attached through another micro bump, solder bump, C4 or other connection 220 to a component substrate 210 superposed over the die. This is covered in underfill, however the particular connection and its protection may be varied to suit different applications.

The component substrate includes a variety of different passive electrical components as desired to provide high Q or isolated devices to the top and bottom dies. The components may include RF transformers, inductors 212 and capacitors 224, such as metal-insulator-metal capacitors, among others. The components are coupled to active circuits 204 of the bottom die 202 using TSVs 216. The components are coupled to the top die 222 using a second micro bump array 228 on the opposite side of the component substrate 210.

In the illustrated example, the top die has an active area with a connection area that is connected directly to the component substrate. The top die is connected to the package substrate 206 through vias 226 that extend through the component substrate and vias 230 that extend through the bottom die to the package substrate. The component substrate 210 also has vias 232 that extend between the top die and the bottom die without any passives. This allows the component substrate to serve two functions, one for supplying passives, and the other for supplying direct connections between the two dies. The component substrate may also have surface paths on the top or bottom or both to transpose a particular micro bump of the top die to a particular one or more of the TSVs. Other connections may also be used, depending on the particular type of package and the nature of the two dies.

The bottom die is covered in a mold compound 208 to seal and isolate the die and its connections to the substrate. The component substrate and the top die are exposed except that the connection areas are covered with underfill. Alternatively, both dies may be covered in the same or additional mold compound. A package cover may also or alternatively be used to cover the dies and the component substrate.

The configuration of FIG. 2 may be used as a system in a package (SIP) in which the top die contains RF circuits and the bottom die contains digital baseband circuits. The component substrate carries high Q passives for the top die and power regulation passives for the bottom die. The dies can be connected together through the component substrate and through the package substrate. Other multiple die configurations may also be used, depending on the particular application.

Figure 3:
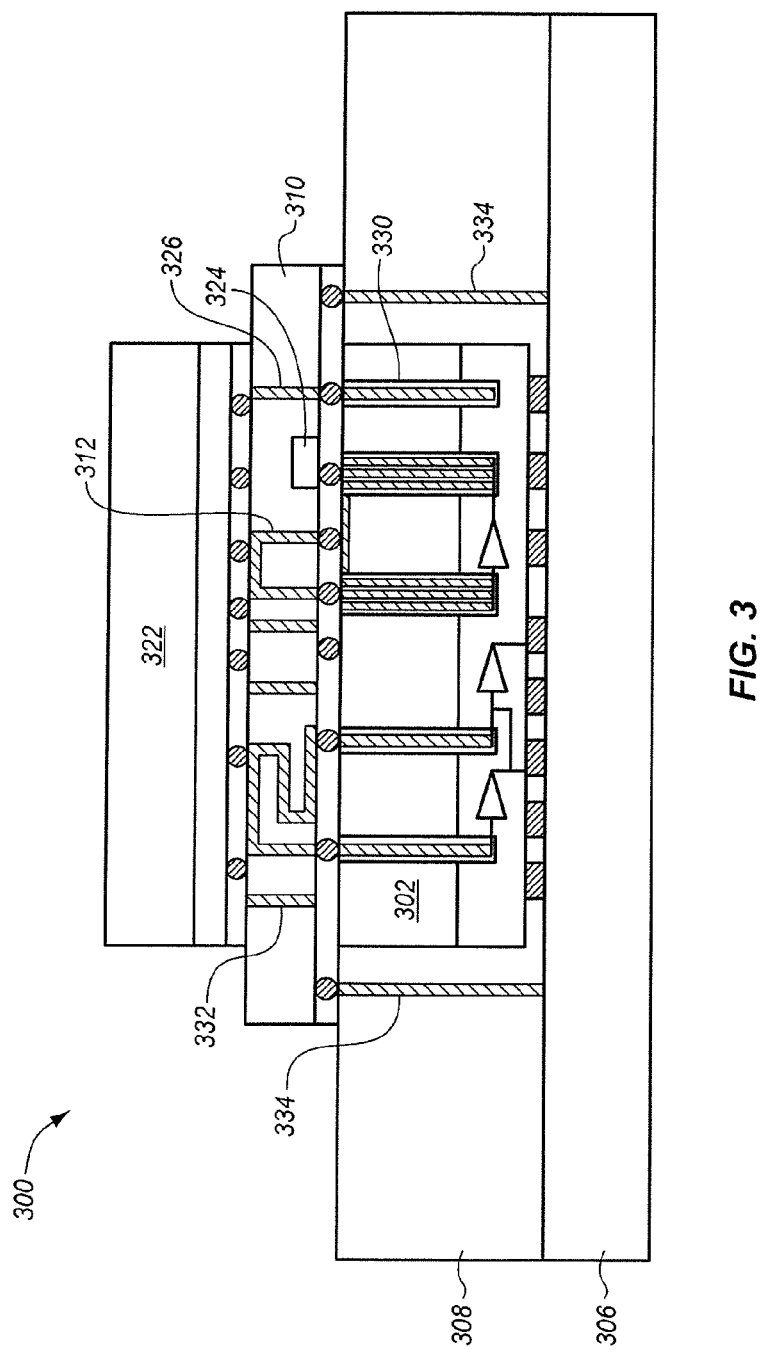
FIG. 3 is a cross-sectional side view of an alternative package using two stacked dies formed using a superposer for passive components according to an embodiment of the invention.

FIG. 3 shows an alternative package 300 to the package 200 of FIG. 2. The component substrate is extended over the bottom die laterally in at least one direction to allow the component substrate to connect to the package substrate without going through the die. In the illustrated example, the component substrate is extended in at least two directions, to the left and right in the drawing figure. However, the substrate may also or alternatively extend in and out of the page for two more directions. In this example, a bottom die 302 is soldered to a package substrate 306. The bottom die is covered in a mold compound 308. A component substrate 310 is connected or soldered over the top of the bottom die and the top die 322 is connected or soldered over the top of the component substrate. The component substrate carries embedded or surface applied inductors 312, capacitors 324 and any other desired passive components that are connected to the top and bottom dies using direct solder bump connections to the top die and TSVs to the bottom die.

As in the example of FIG. 2, there may be connections from the top die directly to the bottom die through a via 326 through the superposer. This connection may or may not include any passive components. The via through the superposer may also connect to a TSV 330 to the package substrate 306 or to the active circuitry of the bottom die. The superposer also allows a path 332 to the package substrate 306 that does not include the bottom die.

As shown, the superposer 310 is wider than the bottom die 302. It is also wider than the top die, although this is not necessary to this implementation. The superposer extends past the bottom die in one or more directions, although only two directions are shown in this cross-sectional diagram. The extensions allow vertical connection pathways 334 directly between the superposer 310 and the package substrate 306. The pathways are shown as through-mold vias (TMV) 334 through the mold compound 308. As with the TSVs, the TMVs may be formed to have an inductance, capacitance, resistance or other desired characteristic that is combined with the properties of the passive on the superposer. Alternatively, for other package types, wire leads may be used to connect the superposer to the substrate or another part of the package.

The direct connections may first connect to one or more passives 312, 324 of the superposer. This may be useful for RF and for power connections, among others. Alternatively, the connections may connect from the substrate to through-body vias 326 through the superposer that connect directly to the top die 322 without connecting through any passives. The vias through the superposer allow the superposer to also provide redistribution and connections functions for the package. By using the superposer as an integrated passive device and a transposer, the package may be made more compact, simpler, and less expensive.

The direct connections of the TMVs into the superposer allow signaling, power delivery, and other types of connections to be made directly from the package substrate to the top die. While this is particularly useful for improving power delivery without overheating the bottom die, it also allows for shorter connections to external components and it allows connections from the top die to the bottom die to be made through the package substrate. As a further alternative, the package 300 may be made without the top die. The TMV connections to the superposer may be used as a secondary path for connections into the bottom die for power deliver and other purposes. Direct connections between the two dies may also be made through the superposer by connecting micro bumps of the top die to TSVs of the bottom die.

Figure 4:
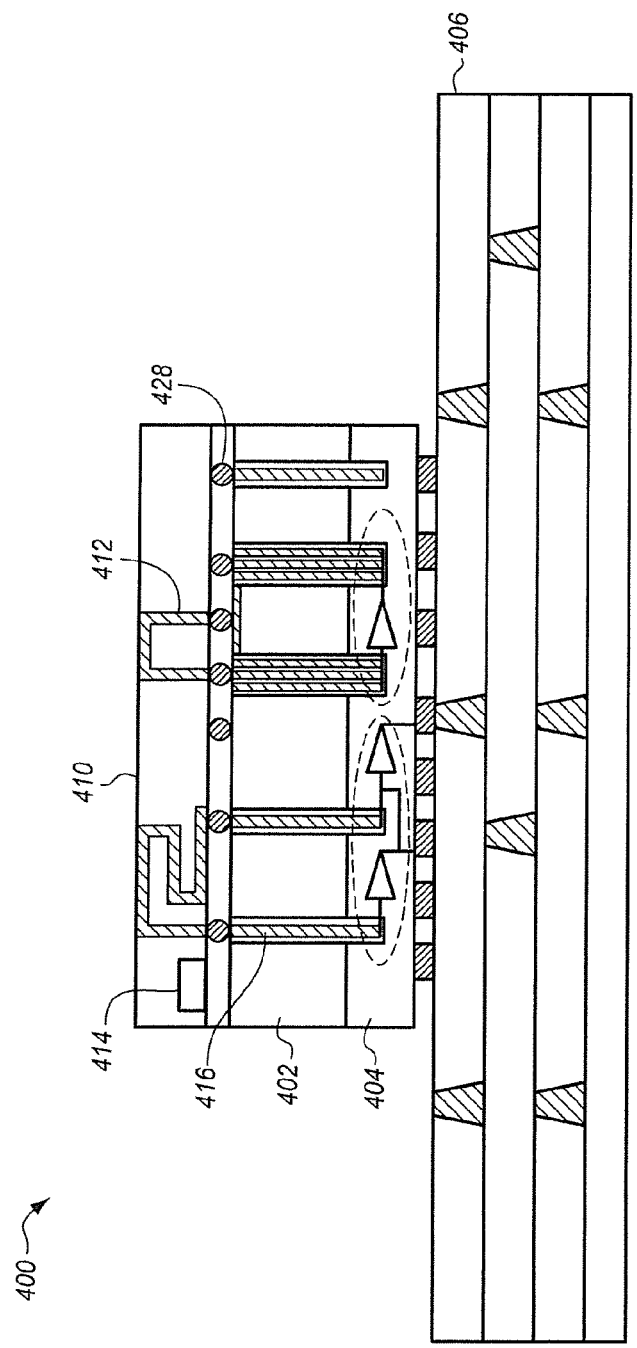
FIG. 4 is a cross-sectional side view of another alternative package using two stacked dies formed using a superposer for passive components according to an embodiment of the invention.

FIG. 4 is a cross-sectional diagram of a flip-chip type of package 400 with a bottom die 402. The front side of the die with the active circuitry 404 is soldered to a substrate 406 that includes transposer and redistribution layers. A component substrate 410 is superposed over the back side of the die and attached for example by micro bumps 428. The superposer 410 includes various passives 412, 414 that are connected to the active circuits 414 by TSVs 416.

The flip chip package 400 is similar to the embedded chip package 100 of FIG. 1 in that it uses a superposer to carry passive components for the die. The same types of connections may be made as in the example of FIG. 1. The die may be an SOC, an RF die, or a digital baseband die. The embedded passives of the superposer may be used for RF, power supply, clocking, and as reference sources for digital circuits. In this and the other examples, the superposer may have about the same surface area as the die as shown or it may be smaller or larger in surface area, depending on how the passives are to be used and connected. The superposer may be extended as in FIG. 3 for wire lead, TMV or other types of connections to the package substrate. The package may also include a cover (not shown) of metal, ceramic, plastic, or mold compound to protect the die and the superposer.

Figure 5:
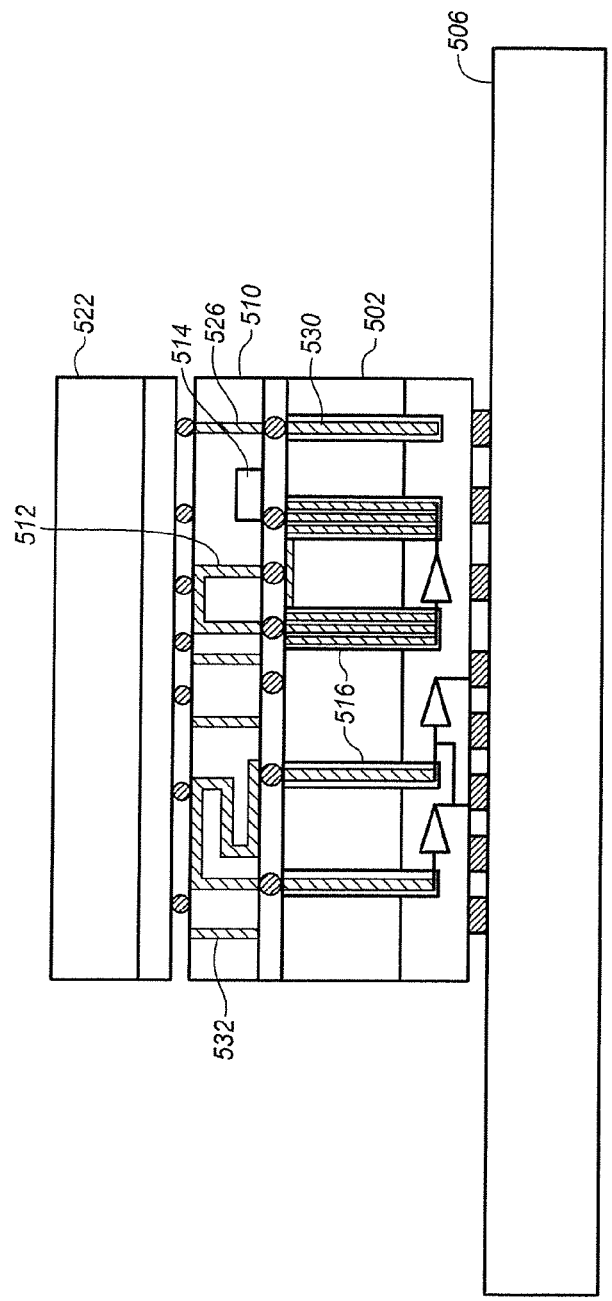
FIG. 5 is a cross-sectional side view of another alternative package using two stacked dies formed using a superposer for passive components according to an embodiment of the invention.

FIG. 5 is a cross-sectional diagram of a stacked die flip chip package 500. In this example, a bottom die 512 is attached to a package substrate 506. A component substrate 510 is superposed over the bottom die and connected to the die with micro bump connections to TSVs 516 through the bottom die. A top die 522 is attached over the component substrate and attached as described above in the other examples. Direct vias 532 through the component substrate connect the two dies to each other. Vias 526, 530 through the component substrate and the bottom die may be used to connect the top die to the package substrate. A variety of other means (not shown) may also be used to connect the top die to the package substrate, depending on the nature of the dies and the package.

The two dies are stacked onto the package substrate with the component substrate in between. The component substrate carries passive components 512, 514, through body vias 526 and may also include surface paths on or within the substrate to make connections between the two dies and to the passives on the component substrate. The package may be covered in any of a variety of different ways depending on the intended use for the die.

The component substrates as shown in the example packages allow a simple and inexpensive connection to off-chip passive components. These components have better electrical performance than those formed within a silicon die. An inductor formed on a glass substrate, for example, has a Q of five to eight times that of inductors implemented on a typical digital silicon die. Partitioning the passives to a separate substrate allows RF circuits to be made even in low resistivity silicon. The off-chip passives allow for high performance while the low resistivity silicon allows the other circuit elements to be efficient and inexpensive.

By assembling the superposer in the die stack, any high current supplied to upper dies does not need to go through the lower dies. This reduces the thermal stress for the lower dies. It also can be used to reduce the impedance and capacitance in the power supply lines. The described configurations also allow the passive components to be placed very close to the dies for which they are used.

In the examples above, the superposer is placed on the back side of the bottom die. This means that the front side connections do not need to be used for the connections to the off-chip passives. The front side connections can already be very dense with power, data, signal, and test connections to the package substrate or RDL. By moving the connections for external passives to the back side of the die, more of the connection area, in this case the first level interconnects, may be made available for other purposes.

In addition, as shown for example in FIG. 3, the component substrate may also be used for power connections. The TMVs from the package substrate to the component substrate may be coupled to power rails. The received power can be conditioned by passive components in the component substrate and then delivered to the die through the TSVs into the back side of the die. Horizontal surface paths on or in the component substrate can transpose the connections as necessary from the projecting part of the component substrate to align with an appropriate TSV. This allows more of the connection area on the front side of the die to be used for other purposes. Power may also be supplied through passive components to the top die.

Figure 6:
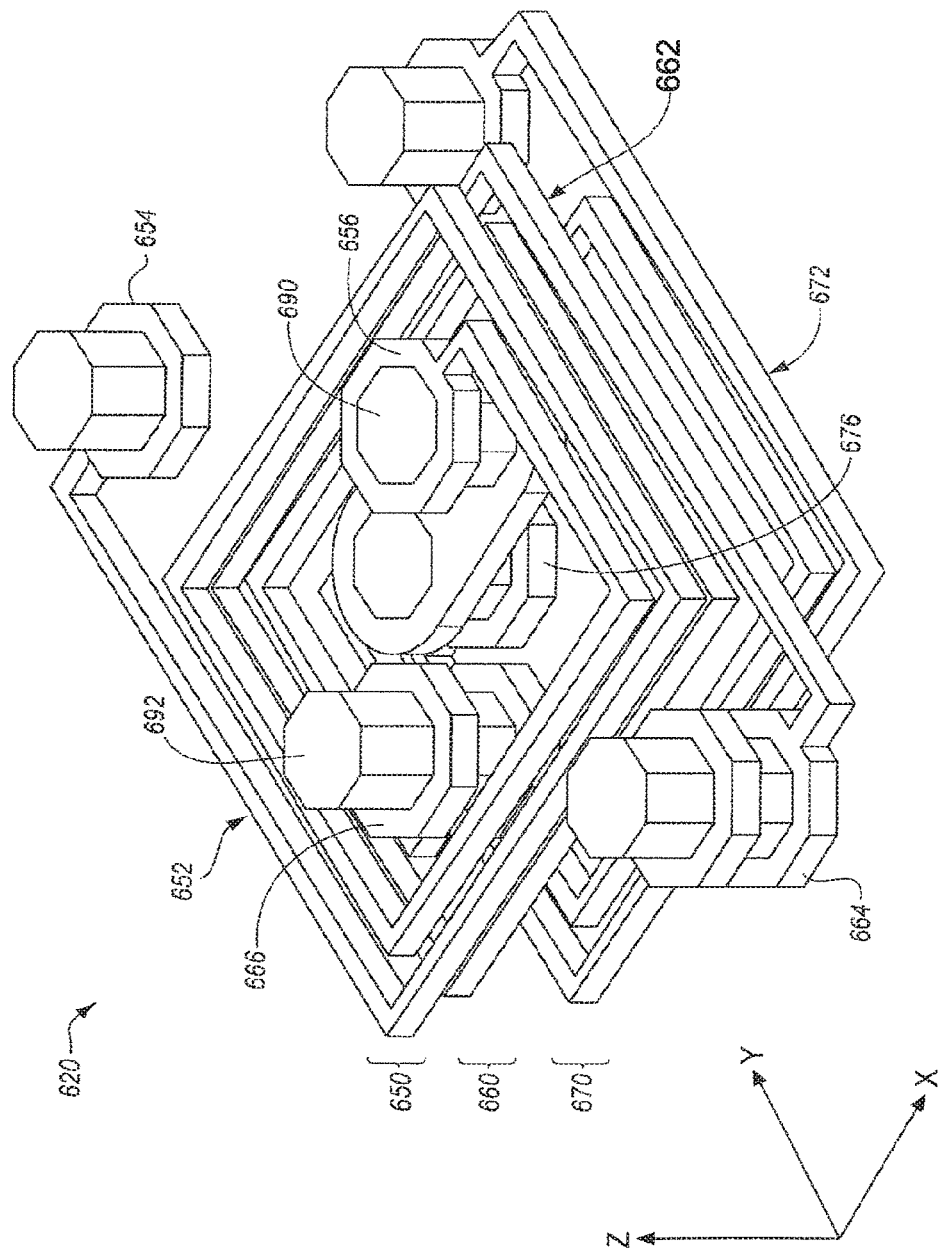
FIG. 6 is an isometric view of passive components in a transparent substrate for use in a package.

FIG. 6 is a perspective elevation view diagram of an example of a transformer 620 that can be formed in a component substrate using a stack of multiple layers of dielectric, such as glass or silicon, and conductive lines such as copper. The patterns are formed by connecting horizontal circular patterns using vertical vias through layers of the stack. Patterns similar to those shown may be used to form inductors, transformers, capacitors and other passive components on or in the component substrate.

The transformer 620 includes a first inductor that includes a first coil 652 and a third coil 672. The first coil 652 is located at a first level 650 of a superposer substrate, for example, the superposer substrate 110 of FIG. 1. The first coil 652 includes a first outer metal pad 654 and a first inner metal pad 656. A first center via 690 is in contact with the first coil 652 at the first level 650 and at the first inner metal pad 656. The first inductor also includes a third coil 672 at a third level 670 of the superposer substrate. The third coil 672 includes a third inner metal pad 676 that is in contact with the first center via 690 and a third outer metal pad 674.

The transformer 620 includes a second inductor that includes a second coil 662 at a second level 660 of the superposer substrate. The second level 660 is between the first level 650 and the third level 670. The second coil 662 includes a second outer metal pad 664 and a second inner metal pad 666 in contact with a second center via 692.

The first inductor begins at the first outer metal pad 654 and ends at the third outer metal pad 674. The second inductor begins at the second outer 664 metal pad and ends at the second inner metal pad 666. Such a transformer 620 exhibits a 2:1 transformative ratio between the first inductor and the second inductor. The transformer 620 may also be referred to as a folded inductor 620 since two coils are laterally folded into each other. The transformer 620 may also be referred to as a three-layer, two-inductor folded transformer 620.

The first coil 652 and the third coil 672 may be electrically connected in series or in parallel. When the first coil 652 and the third coil 672 are connected in series, the inductance is double that of the middle or second inductor. When the first coil 652 and the third coil 672 are connected in parallel, the inductance is half that of the middle inductor. The different connection configurations allow for different inductance ratios required for impedance matching and signal balancing.

Figure 7A:
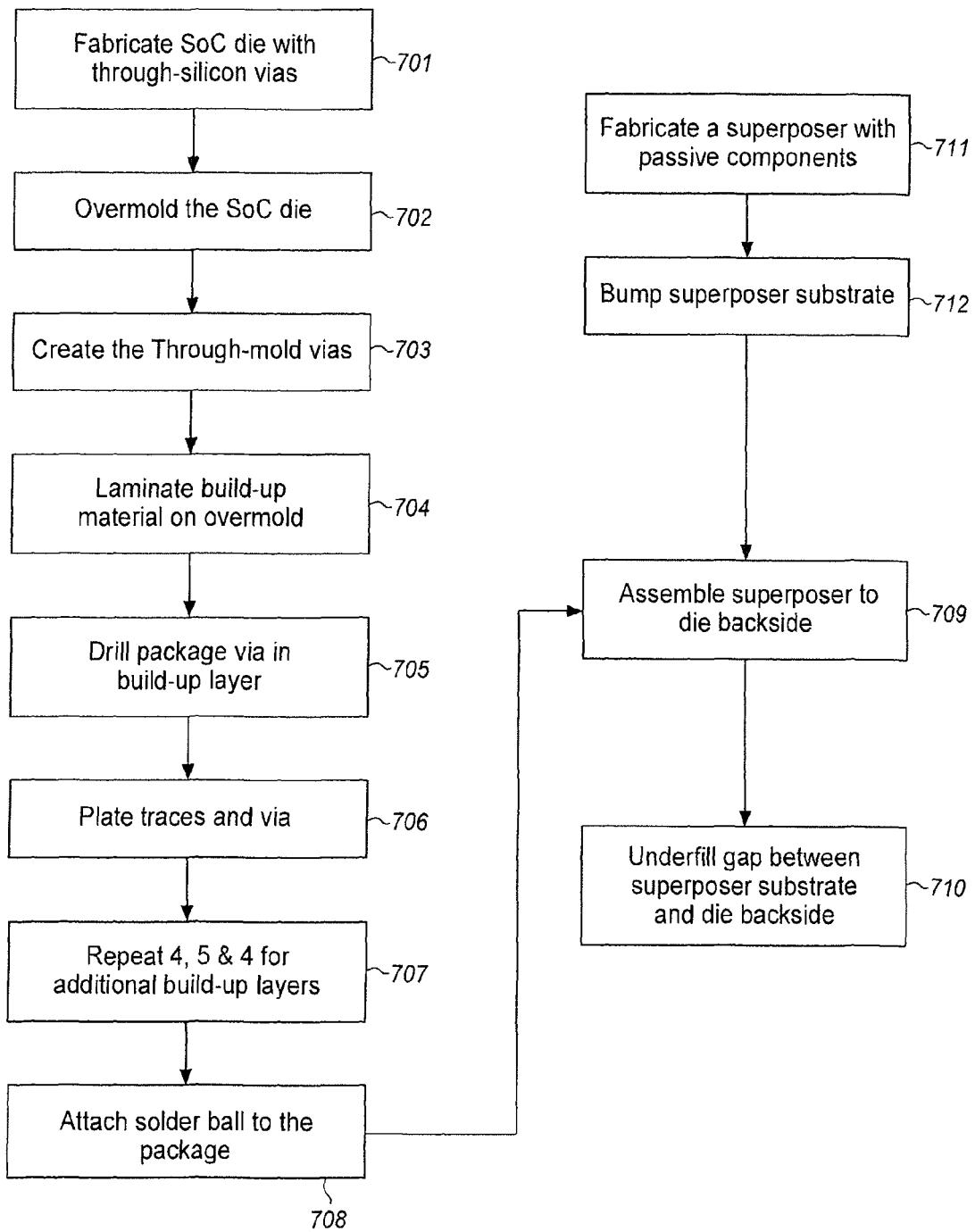
FIG. 7A is a process flow diagram of a part of forming a package according to an embodiment of the invention.

FIG. 7A is a process flow diagram of forming a package 101 with an overmolded die 103 on a coreless substrate 107 such as that of FIG. 1B. In a first branch a SoC die is formed at 701 that includes through-silicon vias. The vias connect die bumps 121 on the back side of the die to front side circuitry. At 702 the SoC die is overmolded with mold compound 109 and at 703, through-mold vias 125 are formed in the molding.

At 704 build-up material 107 is laminated on the overmold to form fan-out, redistribution, or connection patterns, depending on how the package will be used. At 705, package vias are drilled through the build-up layers. This allows for the layers and the vias to connect to each other. At 706, the traces and vias are plated with a conductive material such as copper. This process is repeated at 707 to laminate each of the build-up layers over each other. At 708, the solder balls 123 are attached to the bottom build-up layer to form connection to a system board or other device to which the package will be connected.

In a second branch at 711 a superposer 111 is fabricated with passive components 113 on or in the substrate of the superposer. The superposer is then bumped at 712 so that it may be connected to the vias through pads on the back side of the die. At 709 the superposer is assembled to the back side of the overmolded die. In the example of FIG. 1B, the superposer is electrically connected only to the via pads on the back side of the die. There may be other connections to other vias and to other dies as shown in FIG. 3. At 710, the package is finished. This may include adding underfill between the component substrate and the back side of the die. It may also include filling cavities with mold compound, adding covers, additional dies, or any other steps desired, depending on the particular implementation.

Figure 7B:
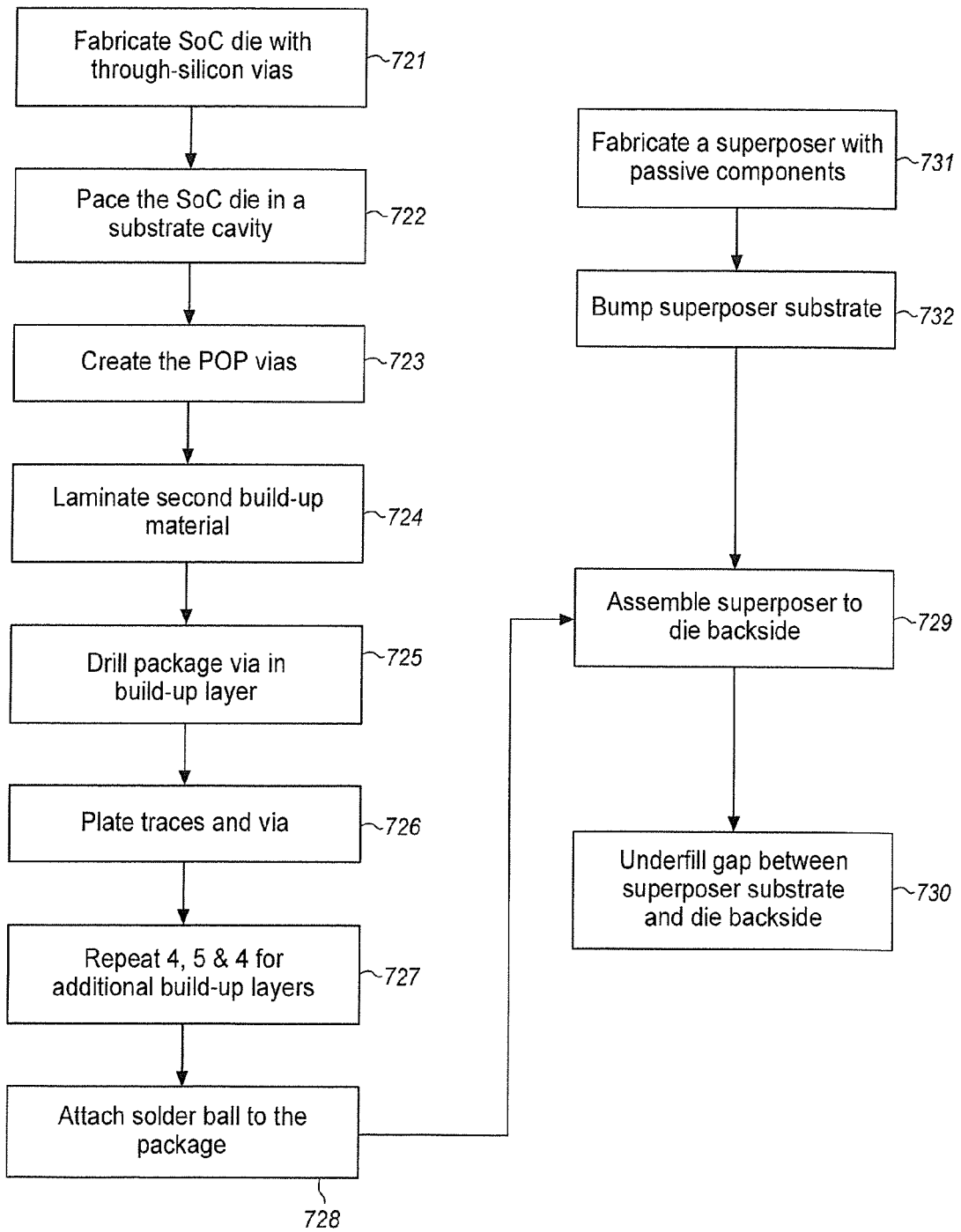
FIG. 7B is an alternative process flow diagram of a part of forming a package according to an embodiment of the invention.

FIG. 7B is a process flow diagram of forming a package with an embedded die on a coreless substrate. Such a package will look very much like that shown in FIG. 1B. The generalized cross-sectional diagrams of the present description may be applied to a variety of different package types. In the first branch at 721, a SoC, or any other appropriate type of die, is fabricated with TSVs to connect to active circuitry to the back side superposer. At 702 the die is placed in a substrate cavity of the coreless substrate. At 723 POP vias are formed in the package substrate to support another die or package above or beside the first die formed at 721.

At 724 build-up material is laminated over the coreless substrate to connect directly to the front side of the die. The build-up layers are formed as in FIG. 7A by laminating a new layer at 724, drilling vias through the layer at 725, plating connection traces and the vias with conductive metals at 725 and then repeating these operations at 727 until all of the desired routing is formed in the laminated build-up layers. A solder ball grid array or any other type of connection system, including a land grid array is attached to the last build-up layer at 728.

The superposer or passive component substrate is fabricated in a separate process at 731. As mentioned above this may be done with a single glass layer or with multiple glass layers. The passive components may use the glass as a dielectric against copper lines and vias. Any of a variety of different shapes and materials may be used and the component substrate may be made from other material that may be better suited to the particular passives that are desired. At 732 connection pads are applied to the component substrate to allow it to be attached to the via pads that are formed on the back side of the die. Copper bumps or solder bumps may be used for such a purpose, although a variety of different types of connectors may be used depending on the particular implementation.

At 729 the die and the superposer are brought together and the assembled using a reflow furnace, pressure, or any of a variety of other techniques. At 730, the package is finished. This may include underfill between the die and the superposer and may also include covers, molding and additional components.

Figure 7C:
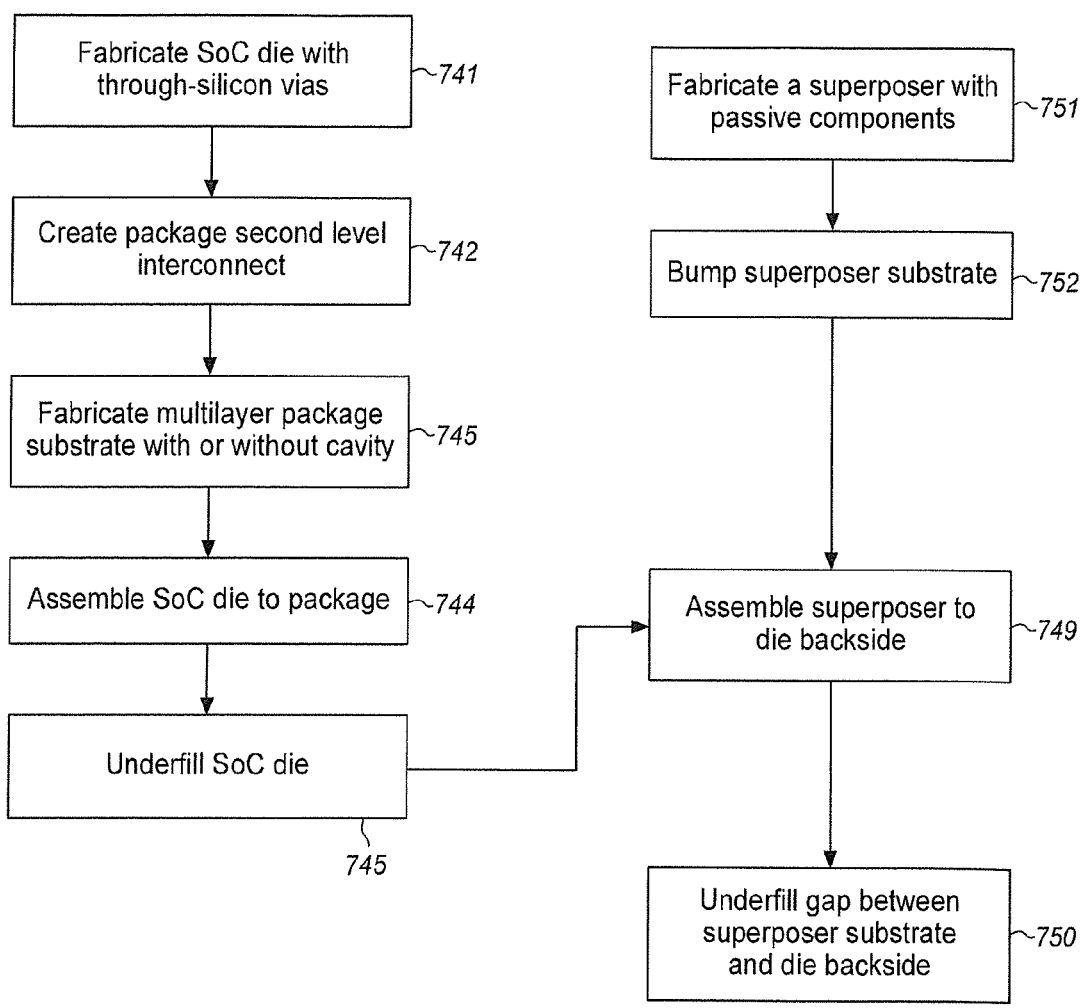
FIG. 7C is another alternative process flow diagram of a part of forming a package according to an embodiment of the invention.

FIG. 7C is a process flow diagram of forming a flip chip package 400 with a die 402 and a superposer 410 such as that of FIG. 4. At 741, the dies is fabricate with TSVs. As with any of the examples herein, the die may be a digital baseband die, a digital signal processing die, a processor or controller die, an analog RF die, a SoC die or any of a variety of other types of dies. At 742 a package substrate is formed. This may be silicon, FR-4 (Fiberglass Reinforced epoxy laminate), molding compound, or any other desired package substrate material. At 743, interconnects are formed in the package, including second level interconnects. At 744, the die is assembled onto the package and at 745 underfill may be applied between the package and the substrate.

At 751, the superposer 410 is formed with passive components 414 on or in the superposer substrate. Vias and pads are also formed to connect the passives to the die. At 752 the pads are bumped for connection to the die. At 749, the superposer and the die are assembled with the die being attached to the back side of the die and to any other vias or paths. At 750, the gap between the component substrate and the back side of the die are underfilled and the package is finished.

Figure 7D:
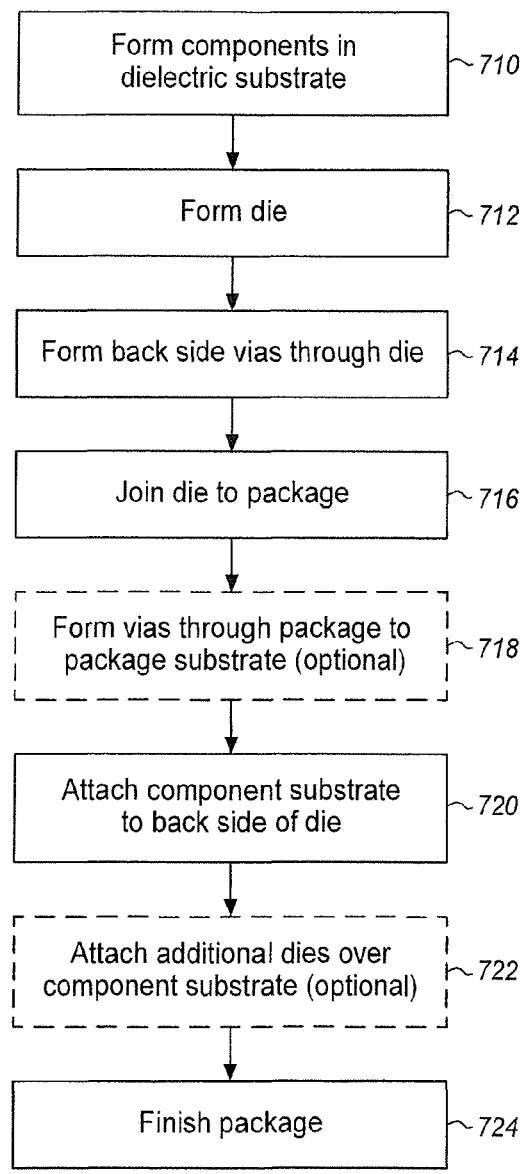
FIG. 7D is another alternative process flow diagram of a part of forming a package according to an embodiment of the invention.

FIG. 7D is a generalized process flow diagram of forming a package as described above and of the types described above using a component substrate. At 710, passive components are formed in a dielectric substrate material such as glass or silicon, among others. The passive components may be similar to those of FIG. 6 and may also include other types of inductors, transformers, capacitors, and resistors, among other components. The substrate may be a single layer or it may be formed of multiple layers sandwiched or laminated together with or without additional horizontal surface connections. The component substrate may also have vertical vias through the substrate and routing paths to make connection from one place to another.

At 712, a die is formed on a silicon or any other type of substrate. The die has a front side upon which the active circuits are formed and a back side that includes the die substrate, typically, but not necessarily, a silicon substrate. At 714 vias are formed through the back side of the die to the active circuits.

At 716, the die is joined to a package substrate of some type. For an embedded die, the die is embedded in a mold compound or similar material, the mold compound is removed over the front side of the die and a redistribution layer is formed over the front side of the die. For a flip chip package, the front side of the die is soldered to a package substrate.

At 718 additional vias may optionally be formed through the package to form connections between the component substrate and the package substrate. These additional vias may be formed through the mold compound for some package types or wire leads may be used later for other package types. The through mold vias allow a connection from the package substrate direct to the component substrate without going through the die. This may be followed by a connection to the die through a through silicon via, a connection to another die, or provide a ground plane for a passive in the component substrate.

At 720, the component substrate is attached to the back side of the die so that connection points on the component substrate align with the vias of the die. This connects the passives of the component substrate to the active circuitry of the die. At 724 the die and passives may then be finished in any of a variety of different ways to obtain any desired package type. At 722 additional dies may optionally be attached to the component substrate opposite the first die. This allows for stacked die configurations.

Figure 8:
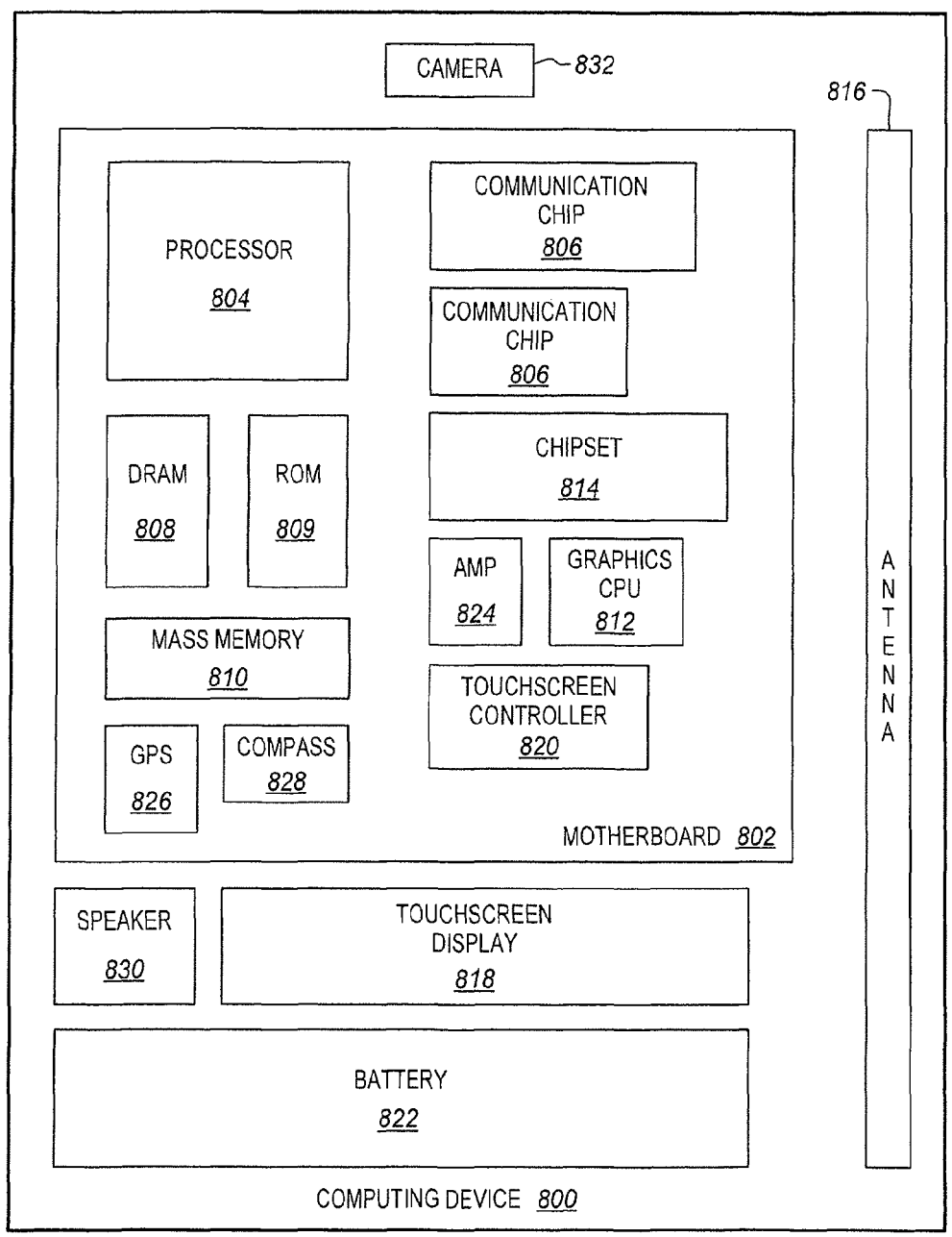
FIG. 8 is a block diagram of a computing device incorporating a package with a according to an embodiment of the invention.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations, the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM) 808, non-volatile memory (e.g., ROM) 809, flash memory (not shown), a graphics processor 812, a digital signal processor (not shown), a crypto processor (not shown), a chipset 814, an antenna 816, a display 818 such as a touchscreen display, a touchscreen controller 820, a battery 822, an audio codec (not shown), a video codec (not shown), a power amplifier 824, a global positioning system (GPS) device 826, a compass 828, an accelerometer (not shown), a gyroscope (not shown), a speaker 830, a camera 832, and a mass storage device (such as a hard disk drive) 810, compact disk (CD) (not shown), digital versatile disk (DVD) (not shown), and so forth). These components may be connected to the system board 802, mounted to the system board, or combined with any of the other components.

The communication chip 806 enables wireless and/or wired communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor, memory devices, communication devices, or other components include one or more dies that are packaged together using a superposer or component substrate, if desired. The term "processor" may refer to any device or portion of a device that processes electronic data from registers and/or memory to transform that electronic data into other electronic data that may be stored in registers and/or memory.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

In the following description and claims, the terms "chip" and "die" are used interchangeably to refer to any type of microelectronic, micromechanical, analog, or hybrid small device that is suitable for packaging and use in a computing device.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a package for a semiconductor die. The package includes a semiconductor die having active circuitry near a front side of the die and having a back side opposite the front side, a component substrate near the back side of the die, a plurality of passive electrical components on the component substrate, and a conductive path to connect a passive component to the active circuitry, wherein the die has a silicon substrate between the front side and the back side and wherein the conductive path is a through-silicon via through the die from the back side to the active circuit.

In further embodiments, the component substrate is connected to the back side of the die. Further embodiments include a package substrate connected to the front side of the die.

In further embodiments, the component substrate is formed of at least one of glass, ceramic, or silicon. In further embodiments, the component substrate comprises a silicon substrate and wherein the passive components are integrated with the silicon substrate. In further embodiments, the active circuitry comprises a radio frequency circuit. In further embodiments, the passive components comprise at least one of inductors, transformers, capacitors, and resistors. In further embodiments, the capacitors comprise metal-insulator-metal capacitors wherein the component substrate serves as the insulator. In further embodiments, the inductors comprise vertical inductors formed in the component substrate.

Some embodiments include a build-up layer substrate on the front side of the die, a mold compound between the component substrate and the build-up layer substrate, and a through-mold via through the mold compound to connect a passive component to the build-up layer substrate.

In further embodiments, the semiconductor die is embedded in the mold compound. Further embodiments include a second semiconductor die connected to the component substrate on a side of the component substrate opposite the first semiconductor die. Further embodiments include a package substrate connected to the front side of the die, a via between the component substrate and the package substrate to connect the second semiconductor die to the package substrate independent of the first semiconductor die.

In further embodiments, the component substrate extends over the first die laterally, the package further comprising a via from the component substrate to carry power to the second die without going through the first die.

Some embodiments pertain to a method that includes forming passive components on a component substrate, forming vias through a back side of a die to circuits of the front side of the die, and attaching the component substrate to the back side of the die so that the passive components are connected to the circuits through the vias.

Some embodiments include embedding the die in mold compound, and forming a package substrate on the front side of the die before attaching the component substrate. Some embodiments include attaching a front side of the die to a package substrate before attaching the component substrate and attaching a cover to the package substrate over the die after attaching the component substrate.

Some embodiments pertain to a computing system that includes a user interface, a memory, and a packaged semiconductor die, the package including a component substrate near a the back side of the die, a plurality of passive electrical components on the component substrate and a conductive path to connect a passive component to active circuitry on a front side of the die. In some embodiments the die has a silicon substrate between the front side and the back side and the conductive path is a through-silicon via through the die from the back side to the active circuit.

Further embodiments include a processor and wherein the packaged semiconductor die is communications die and the active circuitry is analog radio frequency circuitry. In some embodiments the packaged semiconductor die is a system on a chip die, the computing system further comprising a touchscreen display and the user interface is integrated into the touchscreen display.

The invention claimed is:

1. A package for a semiconductor die comprising:
a package substrate, wherein the package substrate is an organic package substrate;
a first semiconductor die having active circuitry near a front side of the die coupled to the package substrate and having a back side opposite the front side, the back side having a plurality of solder bumps;
a component substrate near the back side of the die and opposite the package substrate, the component substrate being electrically coupled to the back side solder bumps;
a plurality of passive electrical components embedded in the component substrate, wherein the component substrate includes only passive components, wherein at least one of the passive electrical components is a transformer, wherein the transformer comprises:
a first inductor having a first coil on a first layer of the component substrate, and a second coil on a third layer of the component substrate; and
a second inductor having a third coil on a second layer of the component substrate, the second layer between the first layer and the third layer;
a conductive path from the component substrate to the package substrate independent of the die;
a conductive path to connect a passive component of the component substrate to the active circuitry through the solder bumps of the die; and
a second semiconductor die connected to the component substrate on a side of the component substrate opposite the first semiconductor die, the component substrate interposing an electrical connection from the second semiconductor die to the back side solder bumps of the back side of the first semiconductor die, wherein passive electrical components of the plurality of passive electrical components embedded in the component substrate are electrically coupled to the active circuitry of the first die and to active circuitry of the second die.

2. The package of claim 1, wherein the component substrate is electrically connected to the back side of the die through the solder bumps and the solder bumps are protected with anunderfill.

3. The package of claim 1, wherein the component substrate is formed of at least one of glass, ceramic, or silicon.

4. The package of claim 1, wherein the component substrate comprises a silicon substrate and wherein the passive components are integrated with the silicon substrate.

5. The package of claim 1, wherein the active circuitry comprises a radio frequency circuit and at least a portion of the passive components are coupled to the radio frequency circuit.

6. The package of claim 1, wherein the passive components comprise at least one of inductors, transformers, capacitors, and resistors.

7. The package of claim 1, above, wherein the capacitors comprise metal-insulator-metal capacitors and wherein the component substrate serves as the insulator.

8. The package of claim 7, wherein the inductors comprise vertical inductors formed in the component substrate.

9. The package of claim 1, further comprising a second semiconductor die connected to the component substrate on a side of the component substrate opposite the first semiconductor die, the component substrate interposing an electrical connection from the second semiconductor die to a through silicon via of the back side of the first semiconductor die.

10. The package of claim 1, further comprising a via from the component substrate to carry power to the second die without going through the first die.

11. A method comprising:
forming passive components that are embedded in a component substrate, wherein at least one of the passive components is a transformer, wherein the transformer comprises:
a first inductor having a first coil on a first layer of the component substrate, and a second coil on a third layer of the component substrate; and
a second inductor having a third coil on a second layer of the component substrate, the second layer between the first layer and the third layer;
forming vias through a back side of a first die to circuits of the front side of the first die;
applying solder bumps over the vias;
attaching the front side of the first die to a package substrate, wherein the package substrate is an organic package substrate;
attaching the component substrate to the back side of the first die so that a passive component is connected to the circuits through solder bumps and the vias, and a conductive path connects the component substrate to the package substrate independent of the first die, wherein the component substrate includes only passive components, and wherein a resistance of the component substrate is greater than a resistance of the first die; and
attaching a second die over the component substrate opposite the first die so that a second passive component of the component substrate is connected to circuits of the second die and so that the second die is electrically connected to the first die through the component substrate, the component substrate interposing connections between the first die and the second die, wherein passive electrical components of the plurality of passive electrical components embedded in the component substrate are electrically coupled to the active circuitry of the first die and to active circuitry of the second die.

12. The method of claim 11, further comprising: embedding the die in mold compound; and
attaching the die to the package substrate before attaching the component substrate.

13. The method of claim 11, further comprising attaching a front side of the die to the package substrate before attaching the component substrate and attaching a cover to the package substrate over the first and the second die after attaching the component substrate.

14. A computing system comprising:
a user interface;
a memory; and
a first and second packaged semiconductor die, the package including a package substrate wherein a front side of the first die is attached to the package substrate, wherein the package substrate is an organic package substrate, a component substrate near a back side of the die opposite the front side of the first die, electrically coupled to the first die, a plurality of passive electrical components embedded in the component substrate, wherein the component substrate includes only passive components, and wherein at least one of the passive electrical components is a transformer, wherein the transformer comprises:
a first inductor having a first coil on a first layer of the component substrate, and a second coil on a third layer of the component substrate; and
a second inductor having a third coil on a second layer of the component substrate, the second layer between the first layer and the third layer, a conductive path from the component substrate to the package substrate independent of the die, a conductive path to connect a passive component to active circuitry on the front side of the first die, wherein the die has a silicon substrate between the front side and the back side and wherein the conductive path is a through-silicon via through the first die from the back side to the active circuitry, and the second die electrically coupled to the component substrate opposite the first die so that the second die is coupled to a second passive component and to the first die through the component substrate, the component substrate interposing connections between the first die and the second die, wherein passive electrical components of the plurality of passive electrical components embedded in the component substrate are electrically coupled to the active circuitry of the first die and to active circuitry of the second die.

15. The computer system of claim 14, further comprising a processor and wherein the first packaged semiconductor die is a communications die and the active circuitry is analog radio frequency circuitry.

16. The computer system of claim 14, wherein the first packaged semiconductor die is a system on a chip die, the computing system further comprising a touchscreen display and wherein the user interface is integrated into the touchscreen display.

17. The computer system of claim 14, wherein the component substrate is configured to transpose a position of an electrical connection from the second semiconductor die to a position of a back side solder bump of the back side of the first semiconductor die and to electrically connect the electrical connection to the back side solder bump.

* * * * *